United States Patent [19]

Hirahara et al.

[11] Patent Number: 6,064,560

[45] Date of Patent: May 16, 2000

[54] ACTIVE CARBON AND PROCESS FOR ITS PRODUCTION

[75] Inventors: Satoshi Hirahara; Mitsuo Suzuki; Kohei Okuyama, all of Yokohama, Japan

[73] Assignee: Mitsubishi Chemicals Corporation, Tokyo, Japan

[21] Appl. No.: 08/829,947

[22] Filed: Apr. 1, 1997

[30] Foreign Application Priority Data

Apr. 10, 1996 [JP] Japan ..................................... 8-113151

[51] Int. Cl.[7] .................................................. C01B 31/00
[52] U.S. Cl. ........................... 361/502; 502/180; 502/416
[58] Field of Search ............................. 361/502; 502/180, 502/416; 423/445 R

[56] References Cited

U.S. PATENT DOCUMENTS

| | | | |
|---|---|---|---|
| 3,696,299 | 10/1972 | Pullman et al. | 361/502 |
| 4,873,218 | 10/1989 | Pekala | 502/418 |
| 5,071,820 | 12/1991 | Quinn et al. | 502/434 |
| 5,607,595 | 3/1997 | Hiasa et al. | 210/672 |

FOREIGN PATENT DOCUMENTS

WO 95/06002  3/1995  WIPO.

*Primary Examiner*—Steven P. Griffin
*Assistant Examiner*—Stuart L. Hendrickson
*Attorney, Agent, or Firm*—Oblon, Spivak, McClelland, Maier & Neustadt, P.C.

[57] ABSTRACT

Active carbon of which the pore size distribution as measured by a Cranston-Inkley method has a peak within each of ranges of from 10 to 20 Å and from 20 to 100 Å.

3 Claims, 4 Drawing Sheets

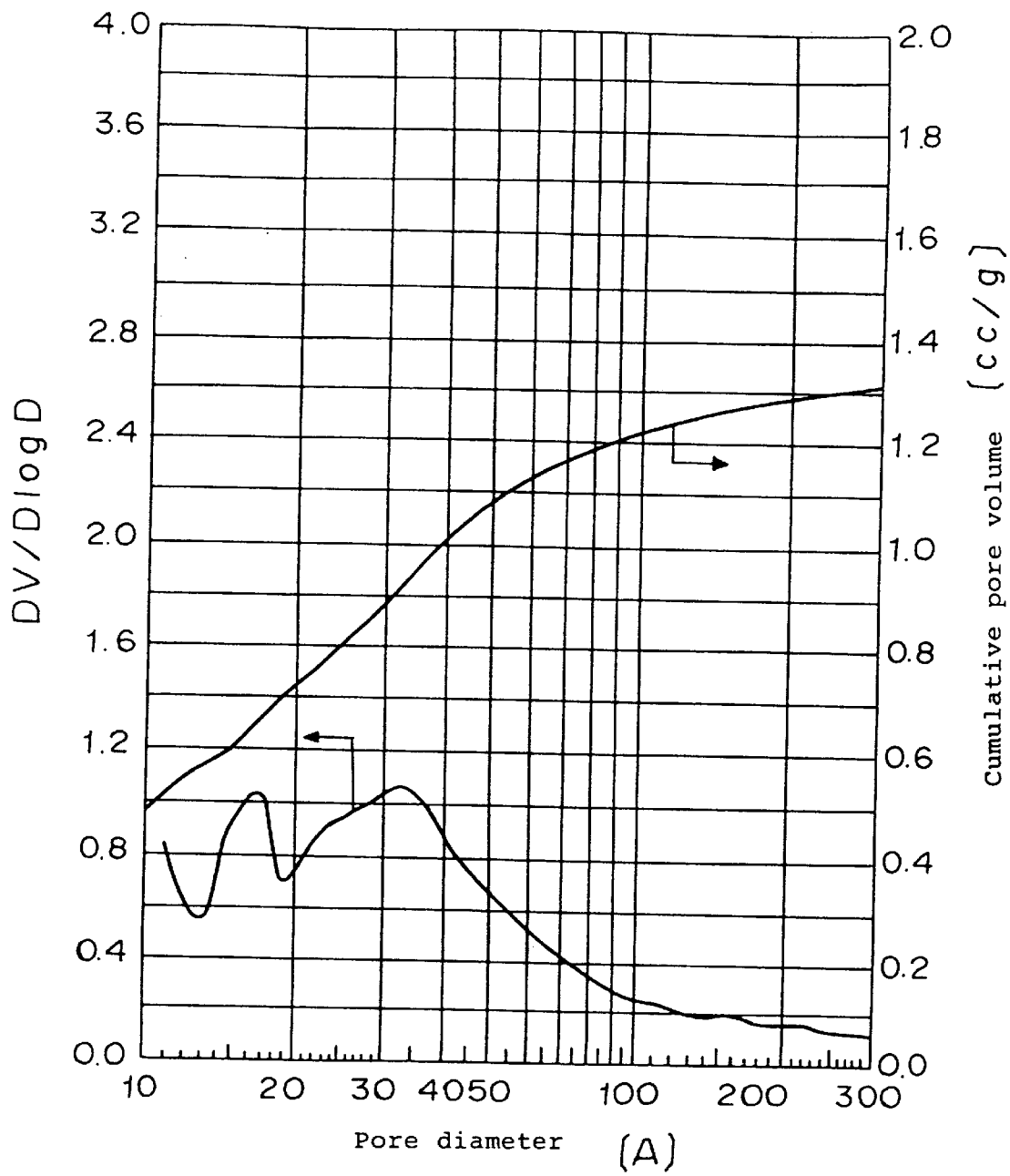

ACTIVE CARBON AND PROCESS FOR ITS PRODUCTION

BACKGROUND OF THE INVENTION

1. Field of the Invention

The present invention relates to active carbon and a process for its production. The active carbon produced by the present invention has micropores present in carbon particles and mesopores formed by linkage of carbon particles, and thus is useful in a technical field of e.g. electrodes for electrochemical capacitors, electrodes for gas sensors, negative electrode materials for lithium secondary cells, water treatment, sewage treatment, waste water treatment, waste gas treatment or carriers for catalysts, where the rate of adsorption is very much influenced by diffusion at the interior of the adsorbent. Further, it is excellent in gas permeability and thus useful as a separator for a gas filter or the like.

2. Discussion of Background

Usually, carbon having a large specific surface area active carbon is meant for in many cases. Active carbon is porous carbon having mainly micropores, and the porosity is provided by activating a solid.

The rate of adsorption is an important index for evaluating the adsorbing ability of an adsorbent such as active carbon. The rate of adsorption is substantially governed by the rate of diffusion at the interior of the adsorbent. Conventional active carbon did not have mesopores very much, whereby the rate of diffusion was small, and it was hardly useful for e.g. an adsorbent for a gas phase.

Further, in a case where a carbonized product of coal, a coconut shell, a resin or the like is to be activated by steam or the like in a process for producing active carbon, if the starting material is in the form of large particles, the activating gas tends to hardly diffuse into the interior of the particles, whereby it has been difficult to uniformly activate the material. Accordingly, a carbon material having a large particle size wherein mesopores are present in a substantial amount, has been desired. Further, with conventional active carbon, it has been technically rather difficult to mold its particles into a spherical or plate form, and active carbon which can be shaped or molded into an optional shape, has been desired.

Recently, a carbon aerogel having a large amount of uniform mesopores, has been developed. This carbon aerogel is agglomerates of ultrafine spherical carbon particles prepared by R. W. Pekala et al. (J. Non-Cryst. Solids, 145, 90, 1992, U.S. Pat. No. 4,873,218), and its structure is somewhat similar to a silica gel. Macromolecularly, it is a black gel substance having a gloss, and it is known to have a specific surface area of from 400 to 1,000 $m^2/g$. The structure of pores of the carbon aerogel has been analyzed mainly by a gas adsorption method. The carbon aerogel has a structural feature such that ultrafine carbon particles are linked to one another, and mesopores of from 20 to 500 Å are uniformly formed by the linkage. It is believed that it further has micropores of not larger than 20 Å in the ultrafine particles. However, the amount of micropores of the carbon aerogel is said to be small at a level of about 10% of the amount of micropores of usual active carbon obtainable by activating coal, a coconut shell or the like with steam or a reagent, whereby there has been a problem that the amount of micropores is not sufficient for its use as an adsorbent for a gas phase.

Pekala et al. further disclose activation of such a carbon aerogel with $CO_2$ in WO 95/06002.

On the other hand, it has recently been attempted to use active carbon for a capacitor. Such a capacitor may be used, for example, as mounted on an electric car wherein a cell is used to generate electricity usually by a chemical reaction and it is usually difficult to supply a large quantity of electric current immediately when such a large quantity of electric current is required, for example, at the time of acceleration or initiation in driving, so that the electricity wanted can be supplied from the capacitor which physically stores such electricity (which is capable of discharging rapidly) when such a large quantity of electric current is required. For such a purpose, active carbon is required to be capable of being charged and discharged rapidly and have a large capacitance, when used as a capacitor.

With conventional active carbon, the properties when it is used as a capacitor, are not fully satisfactory, and further improvements have been desired.

SUMMARY OF THE INVENTION

Under these circumstances the present inventors have conducted various studies on the carbon gel invented by Pekala et al. As a result, they have obtained active carbon having a pore distribution pattern which has not been known heretofore and have found that when such active carbon is used as a capacitor, it is possible to carry out charging and discharging rapidly and to increase the capacitance as compared with a capacitor wherein conventional active carbon is used. The present invention has been accomplished on the basis of these discoveries.

That is, it is an object of the present invention to provide active carbon which is excellent in the capacitance and in the performance of rapid charging and discharging, when used for a capacitor and which has a high rate of adsorption and thus is useful for adsorption of a gas, when used as an adsorbent.

The present invention provides active carbon of which the pore size distribution as measured by a Cranston-Inkley method has a peak within each of ranges of from 10 to 20 Å and from 20 to 100 Å.

Further, the present invention provides a capacitor consisting essentially of conducting plates separated by a dielectric, wherein the dielectric is the active carbon as defined above.

Still further, the present invention provides a process for producing active carbon, which comprises heat-drying an organic gel obtained by polymerizing an aromatic compound having a plurality of phenolic OR groups, to obtain a carbonized carbon aerogel, followed by alkali salts activation of the carbon aerogel.

BRIEF DESCRIPTION OF THE PREFERRED EMBODIMENTS

FIG. 4 is a graph showing the pore size distribution of a carbon material obtained in Example 6.

DETAILED DESCRIPTION OF THE PREFERRED EMBODIMENTS

Figure 1:
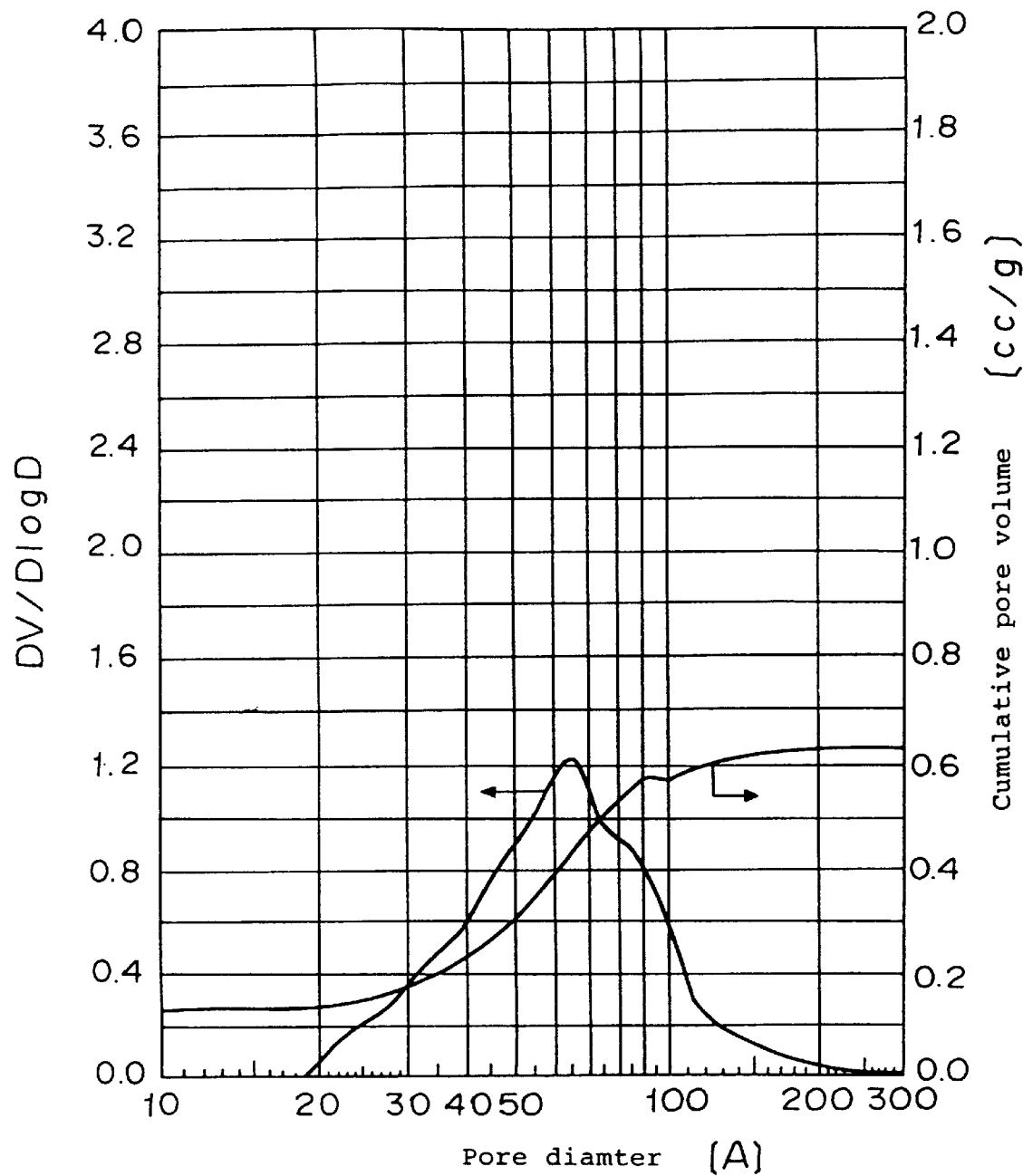
FIG. 1 is a graph showing the pore size distribution of a carbon aerogel obtained in Preparation Example 1.

The active carbon of the present invention is not particularly limited, so long as the pore size distribution as measured by a Cranston-Inkley method has a peak within each of ranges of from 10 to 20 Å and from 20 to 100 Å. The pore size distribution is obtained by calculating the adsorption isotherms of $N_2$ at 77K by Cranston-Inkley method.

The reason as to why active carbon having such a pore size distribution has such a high rate of adsorption, a large capacitance and capability for rapid charging and discharging, has not yet proven, but is considered to be as follows.

Namely, in a case where only micropores having a diameter of not larger than 2 nm are present in a large amount, and the surface area is large, deep pores with narrow inlets are present in a large amount, but only the inlet portions of such deep pores will be effectively useful in a short time, whereby the amount adsorbable in a short time will be small in spite of the large surface area, and the rate of adsorption will be low. On the other hand, if large mesopores are present in a large amount, the surface area itself will be small, whereby the performance tends to be inadequate. It is therefore believed that active carbon having a proper pore size distribution like the active carbon of the present invention, shows excellent properties for both a capacitor and an adsorbent for a gas.

The process for producing the active carbon of the present invention will be described in detail with reference to an embodiment.

Firstly, a carbon aerogel is prepared. For this purpose, a polymer gel is firstly prepared. The preparation of the polymer gel itself can be carried out, for example, by a method by R. W. Pekala (J. Non-Cryst. Solids, 145, 90, 1992). That is, a basic catalyst such as sodium carbonate, sodium hydroxide or ammonia, is added to a mixture comprising resorcinol (1,3-dihydroxybenzene), formaldehyde and water, followed by sol-gel polymerization at a temperature of not higher than 100° C., to form a polymer gel. Of course, the method is not limited to this particular method, so long as a similar polymer gel can be obtained. The polymer gel thus obtained is then dried to obtain an organic aerogel. Here, the present invention is characterized in that drying is carried out without conducting supercritical drying. In the conventional technique by R. W. Pekala et al, a supercritical drying method employing e.g. carbon dioxide gas, is believed to be an effective method for suppressing shrinkage of pores during the drying, for drying the polymer gel. By an extensive study by the present inventors, it has been unexpectedly found that active carbon having excellent properties can be provided by not conducting the supercritical drying. In the present invention, the organic solvent for substitution to be used for converting the polymer gel to an organic aerogel, is not particularly limited, but it is preferably the one having a small interface tension with carbon, such as acetone, hexane, 1-butanol, ethanol or methanol. After substitution by such an organic solvent, the polymer gel is dried in air or in an evaporator to obtain an organic aerogel. The organic aerogel thus obtained, is subjected to heat treatment in an inert atmosphere to obtain a carbon aerogel having mesopores of from 30 to 150 Å, this carbon aerogel is further subjected to alkali activation to obtain the active carbon of the present invention.

The conditions for carbonizing the organic aerogel by heat treatment to obtain the carbon aerogel, can not generally be defined, since they vary depending upon the types of starting materials, the mixing ratio of starting materials, the reaction conditions for the sol-gel polymerization, etc. However, the temperature for the heat treatment is usually from 400 to 1,800° C., preferably from 600 to 1,200° C., in nitrogen gas or in a rare gas such as Ar, He, Xe, Rn or Ne. Usually, if the temperature is lower than 400° C., low molecular weight organic substances in the organic aerogel will not decompose, whereby the specific surface area will not substantially increase. On the other hand, if the temperature for heat treatment exceeds 1,800° C., the specific surface area tends to decrease due to heat shrinkage of pores.

The carbon aerogel thus obtained has a specific surface area of from 400 to 1,000 $m^2/g$. With respect to the shape of the carbon aerogel, the shape at the stage of the polymer gel is substantially maintained, although it undergoes shrinkage during the drying and heat treatment steps to some extent.

Such a carbon aerogel is activated to obtain active carbon. To obtain the active carbon of the present invention from a carbon gel, it is preferred to carry out alkali activation. As another method for activation, steam activation may, for example, be mentioned.

That is, the carbon aerogel obtained by heat-treating the organic aerogel at a temperature of from 400 to 1,000° C., preferably from 450 to 900° C., is pulverized to a size of at most 500 $\mu$m by e.g. a ball mill. The pulverized carbon aerogel is mixed with an aqueous solution of an activating aid such as potassium hydroxide, sodium hydroxide, sodium carbonate, potassium carbonate, zinc chloride or phosphoric acid, in an amount of from 1 to 10 times by weight, preferably from 2 to 5 times by weight, and the mixture is then heat-treated at a temperature of from 400 to 900° C., preferably from 500 to 850° C., usually under atmospheric pressure, in an inert atmosphere, such as nitrogen gas or a rare gas such as He, Ne, Kr or Xe, followed by washing with water, to obtain active carbon having a specific surface area of at least 1,300 $m^2/g$. The time for heat treatment can not generally be defined, since it varies depending upon the type and the amount of the activating aid, the activating temperature, the conditions for preparation of the carbon aerogel as the material to be activated, etc. However, it is usually preferred to conduct activation for at least 10 minutes and at most 10 hours, particularly preferably from 30 minutes to 3 hours. If activation is conducted at a high temperature of at least 1,000° C. for a long time of at least 10 hours by an addition of the activating aid in an amount of at least 10 times by weight, the specific surface area decreases. If the temperature for heat treatment of the organic aerogel is 1,000° C. or higher, the crystallization tends to proceed too much, whereby the specific surface area may not increase even when activated by a reagent.

The specific surface areas and the pore volumes of the carbon aerogel and the activated product of carbon aerogel can be calculated from the adsorbed amounts of nitrogen gas at a liquid nitrogen temperature of 77 K.

The bulk densities of the carbon aerogel and the activated product of carbon aerogel can be obtained by pulverizing the carbon aerogel and its activated product to the same particle size, kneading the respective pulverized products with a binder, followed by molding by a press under a predetermined pressure, whereupon the bulk densities are obtained from the ratio of the weight to the volume of each molded product. With the values thereby obtained, the bulk densities can be relatively compared.

Now, the present invention will be described in further detail with reference to Examples. However, it should be understood that the present invention is by no means restricted to such specific Examples.

Preparation Example 1
Preparation of a Carbon Aerogel

A carbon aerogel was prepared in the following manner. Namely, resorcinol and formaldehyde were dissolved in distilled water in a molar ratio of 1/2, and sodium carbonate as a catalyst was added thereto so that the molar ratio of resorcinol/sodium carbonate would be 200/1. The reaction solution was put into a flask and left in air at room temperature for one day, at 60° C. for one day and at 90° C. for 2 days, and the product thereby obtained was immersed in acetone for about 5 hours. Then, acetone was removed by filtration, and the product was dried in an evaporator at 40° C. to obtain an organic aerogel. This organic aerogel was put into a quartz glass tube set in an electric furnace and subjected to heat treatment at 1,050° C. for one hour in a nitrogen gas stream, to obtain a black carbon aerogel. The specific surface area by a BET method and the pore size distribution by a Cranston-Inkley method from the obtained carbon aerogel, were obtained from the adsorbed amount of nitrogen by Sorptomatic 1800, manufactured by CARLO ERBA Company. The specific surface area is shown in Table 1, and the pore size distribution is shown in FIG. 1.

The obtained carbon aerogel was pulverized to a powder of not larger 100 mesh in a ball mill under a nitrogen atmosphere, and a "Teflon" (trademark for polytetrafluoroethylene) resin was added to the powder in an amount of 10% by weight. The mixture was thoroughly kneaded and then press-molded by a hydraulic press manufactured by Nippon Bunko K.K. under a pressure of 50 kg/cm$^2$ to obtain a disk-shaped molded product having a diameter of 10 mm and a thickness of 0.5 mm. The bulk density of the powder calculated from the weight and the volume of the obtained molded product, is shown in Table 1.

Further, the configuration of the obtained carbon aerogel was observed by a scanning electron microscope Hitachi "S-4500" without gold or platinum vapor deposition, whereby the aerogel was found to be agglomerates of ultrafine carbon particles having a particle size of about 30 Å, and voids having a size of from about 50 to 100 Å were observed among the agglomerated particles.

Further, between two disk-shaped products prepared as described above, a polyethylene separator manufactured by Mitsubishi Chemical Co., Ltd. was inserted, and the entire assembly was sandwiched by two platinum plates useful as current collectors. Further, the entire assembly was sandwiched by two teflon plates having a thickness of 5 mm and provided with four bolt holes, so that the current collectors, the pellets and separator would be in good contact with one another. The electrode portions of the capacitor thus obtained were dipped in a propylene carbonate solution of tetraethylammonium tetrafluoro-borate in a beaker to remove air bubbles attached to the electrodes, to obtain an electric double layer capacitor. Using a charging-discharging apparatus manufactured by Hokuto Denko K.K. and a X-T recorder manufactured by Chino Seisakusho K.K., a constant current charging-discharging cycle test was repeated twice at each of about 5 mA and 1 mA, to obtain the capacitance. The average value of the capacitance obtained by a usual method from the discharge curve, was taken as the capacitance of the prepared capacitor. The obtained value of capacitance is shown in Table 1.

Figure 2:
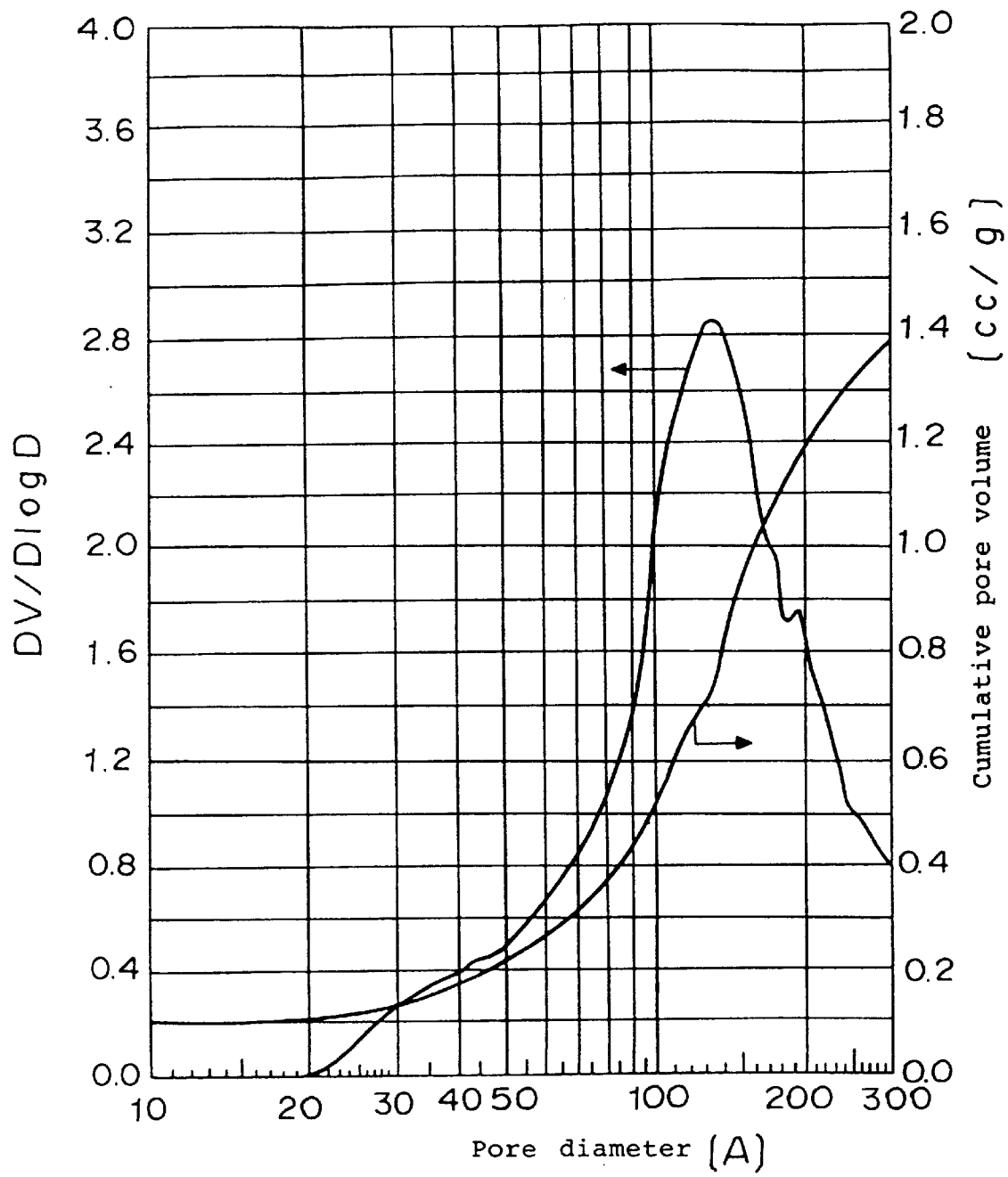
FIG. 2 is a graph showing the pore size distribution of a carbon aerogel obtained in Preparation Example 2.

Preparation Example 2
Preparation of a Carbon Gel Subjected to Supercritical Drying The experiment was carried out in the same manner as in Preparation Example 1 except that in Preparation Example 1, the product after removing acetone by filtration, was subjected to supercritical drying at 40° C. for 2 hours by means of a carbon dioxide gas critical point drying apparatus E3100 model, manufactured by Polaron Company, to obtain an organic aerogel. The specific surface area and the bulk density of the obtained carbon aerogel are shown in Table 1, and the pore size distribution is shown in FIG. 2.

The configuration of the obtained carbon aerogel was found to be agglomerates of ultrafine carbon particles having a particle size of about 30 Å like in Preparation Example 1, but the voids among the particles had a size of from 100 to 200 Å, which was larger than in Preparation Example 1.

EXAMPLE 1

Figure 3:
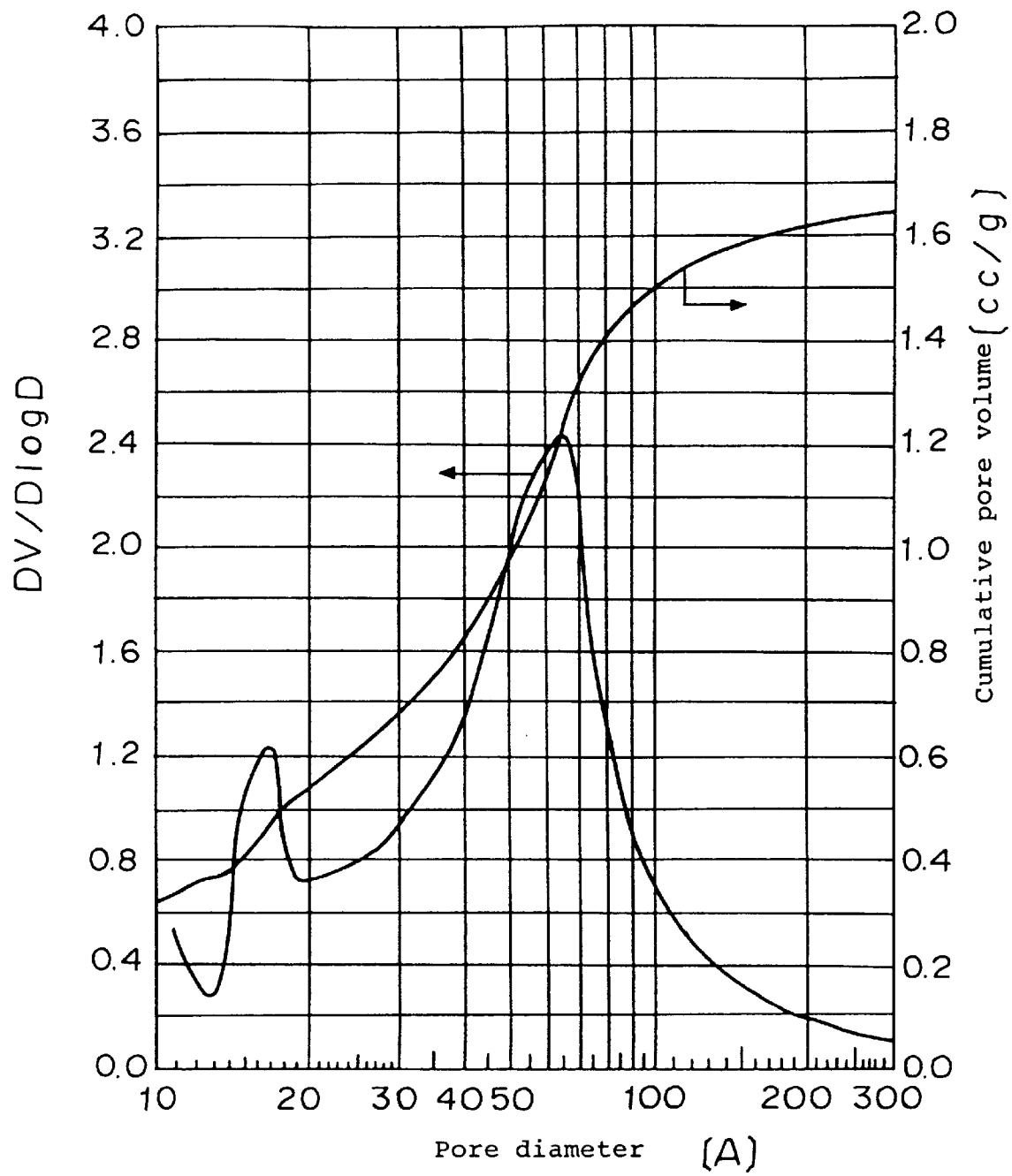
FIG. 3 is a graph showing the pore size distribution of a steam-activated product obtained in Example 1.

About 10 g of the carbon aerogel obtained in Preparation Example 1 was pulverized to a particle size of not larger than 10 mm, and the pulverized product was put into a rotary kiln of a laboratory scale and subjected to heat treatment at 900° C. for 3 hours in a nitrogen stream with a steam concentration of 55%. The specific surface area and the bulk density of the steam-activated product thereby obtained are shown in Table 1, and the pore size distribution is shown in FIG. 3. The configuration of the carbon material thus obtained, as observed by a scanning electron microscope, was the same as the configuration in Preparation Example 1.

Comparative Example 1

About 10 g of the carbon aerogel obtained in Preparation Example 2 was pulverized to a particle size of not larger than 10 mm, and the pulverized product was put into a rotary kiln of a laboratory scale and subjected to heat treatment at 900° C. for one hour in a nitrogen steam with a steam concentration of 55%. The specific surface area and the bulk density of the steam-activated product thereby obtained, are shown in Table 1.

EXAMPLE 2

The experiment was carried out in the same manner as in Example 1 except that the activating time was changed to one hour. The specific surface area and the bulk density of the obtained carbon material, are shown in Table 1.

EXAMPLE 3

The experiment was carried out in the same manner as in Example 1 except that the activating time was changed to two hours. The specific surface area and the bulk density of the obtained carbon material, are shown in Table 1.

EXAMPLE 4

The experiment was carried out in the same manner as in Example 1 except that the activating time was changed to 4 hours. The specific surface area and the bulk density of the obtained carbon material, are shown in Table 1.

Preparation Example 3

The experiment was carried out in the same manner as in Preparation Example 1 except that the heat treatment of the organic aerogel was carried out at 800° C. for one hour. The specific surface area and the bulk density of the obtained carbon aerogel, are shown in Table 1.

EXAMPLE 6

The carbon aerogel obtained in Preparation Example 3, was pulverized to a powder of not larger than 200 µm, and 3 g of the powder was immersed in an aqueous solution having 9 g of potassium hydroxide dissolved therein. Then, this powder was put into a rotary kiln of a laboratory scale, then heated in a nitrogen atmosphere to 800° C. and then maintained at that temperature for one hour, and then cooled to room temperature. Washing with water was repeated five times, and then the product was put into a drier and dried at 115° C. The specific surface area of the powder obtained from the amount of nitrogen adsorbed on the obtained carbon material and the bulk density obtained by the method as described in Preparation Example 1, are shown in Table 1, and the pore size distribution is shown in FIG. 4. The configuration of the obtained carbon material as observed by a scanning electron microscope, was the same as the configuration in Preparation Example 1.

EXAMPLE 7

The experiment was carried out in the same manner as in Example 6 except that in Example 6, 6 g of potassium hydroxide was used. The specific surface area of the powder obtained from the amount of nitrogen adsorbed on the obtained carbon material and the bulk density obtained by the method as described in Preparation Example 1, are shown in Table 1.

EXAMPLE 8

The experiment was carried out in the same manner as in Example 6 except that in Example 6, 12 g of potassium hydroxide was used. The specific surface area of the powder obtained from the amount of nitrogen adsorbed on the obtained carbon material and the bulk density obtained by the method as described in Preparation Example 1, are shown in Table 1.

TABLE 1

|  | Specific surface area | Bulk density | Capacitance (F) at 1 mA | Capacitance (F) at 5 mA |
| --- | --- | --- | --- | --- |
| Preparation Example 1 | 684 m$^2$/g | 0.67 g/cc | 0.46 | 0.36 |
| Preparation Example 2 | 784 m$^2$/g | 0.34 g/cc | 0.28 | 0.26 |
| Example 1 | 2183 m$^2$/g | 0.44 g/cc | 0.86 | 0.74 |

TABLE 1-continued

|  | Specific surface area | Bulk density | Capacitance (F) at 1 mA | Capacitance (F) at 5 mA |
| --- | --- | --- | --- | --- |
| Comparative Example 1 | 1448 m$^2$/g | 0.27 g/cc | 0.48 | 0.46 |
| Example 2 | 1333 m$^2$/g | 0.54 g/cc | 0.90 | 0.72 |
| Example 3 | 1764 m$^2$/g | 0.46 g/cc | 0.86 | 0.76 |
| Example 4 | 2646 m$^2$/g | 0.36 g/cc | 0.78 | 0.72 |
| Example 5 | 743 m$^2$/g | 0.69 g/cc | 0.58 | 0.42 |
| Example 6 | 2270 m$^2$/g | 0.45 g/cc | 1.08 | 0.86 |
| Example 7 | 1730 m$^2$/g | 0.55 g/cc | 1.06 | 0.78 |
| Example 8 | 2603 m$^2$/g | 0.39 g/cc | 1.02 | 0.82 |

According to the present invention, it is possible to provide active carbon of which the pore structure is substantially different from conventional active carbon. As a result, the application can be expanded to a field where an increase in the rate of adsorption is desired, such as a field of e.g. electrode materials for electric double layer capacitors, lithium secondary cells or gas sensors, waste gas treatment, waste water treatment, catalyst carrier, or gas filters. Thus, its value for industrial application is significant.

What is claimed is:

1. Active carbon of which the pore size distribution as measured by a Cranston-Inkley method has a peak within each of ranges of from 10 to 20 Å and from 20 to 100 Å.

2. A capacitor consisting essentially of conducting plates separated by a dielectric, wherein the dielectric is the active carbon as defined in claim 1.

3. A process for producing the active carbon, of claim 1 which comprises heat-drying an organic gel obtained by polymerizing an aromatic compound having a plurality of phenolic OH groups, to obtain a carbonized carbon aerogel, followed by alkali salts activation of the carbon aerogel.

* * * * *

UNITED STATES PATENT AND TRADEMARK OFFICE
CERTIFICATE OF CORRECTION

PATENT NO. : 6,064,560
DATED : May 16, 2000
INVENTOR(S): Satoshi HIRAHARA, et al.

It is certified that an error appears in the above-identified patent and that said Letters Patent is hereby corrected as shown below:

On the title page, item [30], The Foreign Application Priority Data is incorrectly listed. It should read as follows:

--[30]   Foreign Application Priority Data

Apr. 10, 1996   [JP]   Japan........8-113150--

Also the Assignee Information is incorrect. It should read as follows:

--[73]   Assignee:   Mitsubishi Chemical Corporation,
                     Tokyo, Japan--

Signed and Sealed this

Third Day of April, 2001

*Attest:*

NICHOLAS P. GODICI

*Attesting Officer*    *Acting Director of the United States Patent and Trademark Office*